United States Patent [19]
Lin et al.

[11] Patent Number: 6,110,330
[45] Date of Patent: Aug. 29, 2000

[54] PROCESS FOR BONDING LUBRICANT TO MAGNETIC DISK

[75] Inventors: Moon-Sun Lin, Hsinchu; Lem-San Young, Chung-Li; Che-Hsien Lin, I-Lan Hsien; Hung-Huei Liang, Chang-Hua Hsien, all of Taiwan

[73] Assignee: Trace Storage Technology Corp, Hsinchu, Taiwan

[21] Appl. No.: 09/345,610

[22] Filed: Jun. 28, 1999

[51] Int. Cl.[7] .............................. C23C 14/34; G11B 5/725
[52] U.S. Cl. .................... 204/192.16; 204/192.1; 204/192.12; 204/192.15; 204/298.07; 204/298.02; 428/65.4; 428/65.5; 428/694 TP; 428/694 TC; 428/694 SG; 428/695; 360/135; 427/569; 427/577; 427/580; 427/906
[58] Field of Search ...................... 204/192.1, 192.12, 204/192.15, 192.16, 298.07, 298.02; 428/65.4, 65.5, 694 TP, 694 TC, 694 SG, 695; 360/135; 427/569, 577, 580, 906

[56] References Cited

U.S. PATENT DOCUMENTS

| | | | |
|---|---|---|---|
| 4,642,246 | 2/1987 | Janssen et al. | 427/127 |
| 4,960,609 | 10/1990 | Homola et al. | 427/490 |
| 5,030,478 | 7/1991 | Lin et al. | 427/558 |
| 5,520,981 | 5/1996 | Yang et al. | 428/65.5 |
| 5,650,900 | 7/1997 | Wei et al. | 360/135 |
| 5,824,387 | 10/1998 | Boutaghou et al. | 428/65.5 |
| 5,945,191 | 8/1999 | Hwang et al. | 428/65.5 |

*Primary Examiner*—Alan Diamond
*Attorney, Agent, or Firm*—W. Wayne Liauh

[57] ABSTRACT

This invention relates to a process for forming a lubricant layer of differing thickness on distinct zones of a maonetic disk of a hard disk drive without heating, inert gas plasma and UV-radiation or E-beam exposition. According to the present invention. an overcoat layer with distinct zones of differing thickness is first sputtered on the disk surface by using distinct masks under different sputtering conditions. A lubricant layer is then uniformly coated on the overcoat layer. Since a part of lubricant is bonded to the overcoat to form a bonded lubricant layer and the thickness of the bonded lubricant layer relates to the overcoat layer's property, a free lubricant layer with zoned thickness is consequently formed, which the free lubricant layer consists of the leftover lubricant. The zoned lubricant layer of the invention hence decreases the flying stiction.

20 Claims, 10 Drawing Sheets

|   | Control variable | 1 | 2 | 3 |
|---|---|---|---|---|
| A | H2 | 10% | 25% | 40% |
| B | N2 | 10% | 25% | 40% |
| C | Sputter Power | 0.5kw | 1.0kw | 1.5kw |
| D | Gas Flow | 15sccm | 25sccm | 40sccm |
| E | Dwell Time | 0.9min | 3min | 10min |
| F | Drain Rate | 74mm/min | 120mm/min | 164mm/min |
| G | N2 Purge | Yes | No | |
| H | Lube Concentration | 0.02%~0.1% | 0.1%~0.25% | |

FIG. 3

| Position<br>Thickness or Ratio | Landing zone | Data zone |
|---|---|---|
| Thickness | 5~13Å | 5~13Å |
| Ratio | 25%~65% | 25%~65% |

FIG. 13

| L18 | Control variable | | | | | | | | Thickness | | | | | | | | S/N |
| --- | --- | --- | --- | --- | --- | --- | --- | --- | --- | --- | --- | --- | --- | --- | --- | --- | --- |
| | A | B | C | D | E | F | G | H | Disk1 | | | | Disk2 | | | | |
| | | | | | | | | | ID1 | ID2 | MD1 | MD2 | ID1 | ID2 | MD1 | MD2 | |
| A1 | 1 | 1 | 1 | 1 | 1 | 1 | 1 | 1 | 5.38 | 5.63 | 5.63 | 5.38 | 5.89 | 5.38 | 5.89 | 6.40 | 15.07 |
| A2 | 1 | 2 | 2 | 2 | 2 | 2 | 2 | 1 | 4.35 | 4.10 | 4.86 | 5.38 | 4.61 | 4.86 | 5.38 | 5.63 | 13.66 |
| A3 | 1 | 3 | 3 | 3 | 3 | 3 | 2 | 1 | 5.38 | 4.86 | 5.89 | 5.12 | 4.86 | 5.89 | 5.38 | 4.86 | 14.38 |
| A4 | 2 | 1 | 1 | 2 | 2 | 3 | 3 | 1 | 5.38 | 4.86 | 4.61 | 5.38 | 5.63 | 4.86 | 4.35 | 4.86 | 13.88 |
| A5 | 2 | 2 | 2 | 3 | 3 | 1 | 1 | 1 | 5.38 | 5.38 | 6.40 | 5.63 | 6.14 | 5.89 | 6.40 | 6.14 | 15.39 |
| A6 | 2 | 3 | 3 | 1 | 1 | 2 | 2 | 1 | 4.35 | 5.12 | 4.86 | 4.35 | 4.61 | 5.12 | 4.61 | 4.61 | 13.40 |
| A7 | 3 | 1 | 2 | 1 | 3 | 2 | 2 | 1 | 5.38 | 6.14 | 5.89 | 4.61 | 5.63 | 5.38 | 5.12 | 5.89 | 14.72 |
| A8 | 3 | 2 | 3 | 2 | 1 | 3 | 1 | 1 | 5.63 | 5.89 | 5.38 | 4.86 | 5.89 | 4.86 | 6.14 | 6.40 | 14.89 |
| A9 | 3 | 3 | 1 | 3 | 2 | 1 | 2 | 1 | 5.89 | 6.14 | 5.38 | 5.89 | 5.38 | 5.12 | 6.14 | 6.40 | 15.19 |
| A10 | 1 | 1 | 3 | 3 | 2 | 2 | 1 | 2 | 7.68 | 7.42 | 7.42 | 7.94 | 7.42 | 7.42 | 7.68 | 7.94 | 17.62 |
| A11 | 1 | 2 | 1 | 1 | 3 | 3 | 2 | 2 | 7.68 | 6.91 | 6.66 | 7.42 | 7.68 | 7.17 | 6.14 | 6.14 | 16.78 |
| A12 | 1 | 3 | 2 | 2 | 1 | 1 | 2 | 2 | 6.14 | 6.40 | 6.40 | 6.40 | 6.14 | 7.17 | 6.40 | 7.42 | 16.28 |
| A13 | 2 | 1 | 2 | 3 | 1 | 3 | 2 | 2 | 6.40 | 6.40 | 6.91 | 6.91 | 7.42 | 6.66 | 7.42 | 6.66 | 16.67 |
| A14 | 2 | 2 | 3 | 1 | 2 | 1 | 1 | 2 | 6.97 | 7.17 | 7.42 | 7.42 | 7.42 | 7.68 | 7.42 | 7.68 | 17.36 |
| A15 | 2 | 3 | 1 | 2 | 3 | 2 | 2 | 2 | 11.78 | 12.03 | 11.01 | 11.26 | 12.03 | 11.78 | 11.52 | 11.78 | 21.31 |
| A16 | 3 | 1 | 3 | 2 | 3 | 1 | 1 | 2 | 9.47 | 9.47 | 9.73 | 9.98 | 9.47 | 10.50 | 9.47 | 10.24 | 19.80 |
| A17 | 3 | 2 | 1 | 3 | 1 | 2 | 2 | 2 | 9.47 | 9.22 | 9.73 | 9.73 | 9.98 | 10.50 | 9.47 | 9.98 | 19.77 |
| A18 | 3 | 3 | 2 | 1 | 2 | 3 | 1 | 2 | 13.06 | 12.29 | 13.31 | 12.29 | 12.80 | 13.31 | 13.06 | 12.80 | 22.18 |

FIG. 4

| Control variable | 1 | 2 | 3 | Δ(3−1) |
|---|---|---|---|---|
| H2 | 15.63 | 16.34 | 17.76 | 2.13 |
| N2 | 16.29 | 16.31 | 17.12 | 0.83 |
| Sputter Power | 17.00 | 16.48 | 16.24 | 0.76 |
| Gas Flow | 16.02 | 16.65 | 17.06 | 1.04 |
| Soaking Time | 16.58 | 16.64 | 16.50 | 0.14 |
| Drain Rate | 16.51 | 16.75 | 16.46 | 0.29 |
| N2 Purge | 17.74 | 15.99 | ### | 1.75 |
| Lube Concentration | 14.51 | 18.64 | ### | 4.13 |

FIG. 5

| | H2 | N2 | Power | Gas Flow | Dwell Time | Drain Rate | Purge | Conc. | S/N |
|---|---|---|---|---|---|---|---|---|---|
| Present condition A1B1C2D2E1F1G2H1 | 10% | 10% | 1.0kw | 25sccm | 0.9min | 74mm/min | No | 0.06% | 12.62 |
| Preferable condition A3B3C1D3E2F2G1H2 | 40% | 40% | 0.5kw | 40sccm | 3min | 120mm/min | Yes | 0.18% | 22.69 |
| | | | | | | | | Increase | 10.09 |

FIG. 9

PROCESS FOR BONDING LUBRICANT TO MAGNETIC DISK

BACKGROUND OF THE INVENTION

This invention pertains to a process for bonding lubricant to a magnetic disk and more particularly, to a process for bonding lubricant to a magnetic disk of a hard disk drive in order to decrease the flying stiction during the operation of the hard disk drive.

Hard disk drives generally use magnetic head assembly which contains air bearing sliders to read/write data on the surfaces of magnetic disks. Magnetic head assembly is supported and moved by actuator arms for positioning. In addition the slider of the hard disk drive contains read/write transducers for data acquisition and storage. Generally, magnetic disks have two discrete zones. A "landing zone" (or "CSS zone" abbreviated from "Contact Start Stop zone") is the zone where the slider rests while the hard disk drive is off, and takes off when the hard disk drive is started up. A "data zone" is the zone where the slider flies and reads/stores data by using the read/write head. The landing zone usually locates in the inner diameter of the magnetic disk.

When the power of a hard disk drive is turned on, enough force has to be applied for the slider to overcome the static friction or "stiction" force on the slider. During takeoff and landing, the slider maintains almost constant contact with the magnetic disk. Lubricant over the landing zone is important for decreasing wear and drag force during takeoff and landing. The CSS test method is commonly used for the stiction/wear durability measurement. This stiction is measured by repeating takeoff and landing of the magnetic head assembly until wear of the disk surface is induced. The measured data of static stiction is an important factor to predict the lifetime of a hard disk drive.

As the speed of the magnetic disk increases, the air in contact with the surface of the magnetic disk lifts the slider away from the surface. During the read/write (R/W) operation of the hard disk drive, the magnetic head assembly is moved by the actuator arm to fly over the data zone without contacting the magnetic disk. However, the magnetic head assembly occasionally contacts the disk during R/W operation. Most of these in-flight contacts are caused by collision of the slider with media asperity, corrosion products or other contaminant particles. Lubricant on the data zone minimizes wear and damage to the disk due to these in-flight contacts, but increases the flying stiction between the magnetic head assembly and the disk surface. In addition, in order to prevent damage caused by contacts, a protective overcoat of diamond-like carbon is sputtered on the magnetic disk about 200 Angstroms thick. A lubricant layer is then formed upon the overcoat layer about 20 Angstroms thick. In general, the lubricant layer includes a bonded lubricant layer bonding to the overcoat layer and a free lubricant layer upon the bonded lubricant layer. The typical thickness of the bonded lubricant layer is of about 4 to 8 Angstroms, and that of the free lubricant layer is of about 12 to 16 Angstroms.

In the hard disk drives with thin-film heads of the prior art, the typical fly height of the sliders is of about 2 micro-inch (about 500 Angstroms). However, in the present hard disk drives with magneto-resistive (MR) heads, the fly height of the slider decreases to about 1 micro-inch (about 250 Angstroms). Hence, the pressure between the slider and the disk surface becomes sub-ambient more to do with the vacuum pressure air bearing design. Consequently, lubricant on the disk surface is easily absorbed to the slider, and this will increase the flying stiction of the magnetic head assembly.

U.S. Pat. Nos. 4,960,609, 4,642,246 and 5,030,478 respectively disclose inert gas plasma, heating and UV radiation methods for forming a lubricant layer on a disk. With the above methods of the prior art, the CSS test at high temperature (35 degrees C) and humidity (80% RH) of hard disk drives can be passed since the thickness of the free lubricant layer on the data zone according to the prior art is decreased. Hence, the flying stiction of the magnetic head assembly on the data zone is obviously reduced. Unfortunately, the thickness of the free layer on the landing zone is also decreased. Thismay induce wear of the disk surface. In order to solve the above problem, a magnetic disk with zoned lubricant thickness is proposed by the U.S. Pat. No. 5,650,900.

SUMMARY OF THE INVENTION

One objective of the present invention is to provide a magnetic disk with distinct zones of differing lubricant thickness for decreasing the flying stiction on the disk surface. According to the present invention a magnetic disk is first coated with a overcoat layer of differing composition on distinct zones of the disk surface, and a lubricant layer with a bonded lubricant layer and a free lubricant layer is then formed on the overcoat layer. With the relation that the thickness of the bonded lubricant layer and the free lubricant layer depends on the overcoat layer's property (such as thickness and chemistry), the magnetic disk with distinct zones of differing lubricant thickness is consequently made for decreasing the flying stiction on the disk surface.

Another objective of the present invention is to provide a process for forming a lubricant layer of differing thickness on distinct zones of a magnetic disk of a hard disk drive without heating, inert gas plasma and UV-radiation or E-beam exposition. According to the present invention, an overcoat layer with distinct zones of differing composition is first sputtered on the disk surface by using distinct masks under different sputtering conditions. A lubricant layer is then uniformly coated on the overcoat layer. Since a part of lubricant is bonded to the overcoat to form a bonded lubricant layer and the thickness of the bonded lubricant layer relates to the overcoat layer's property, a free lubricant layer with zoned thickness is consequently formed, which the free lubricant layer consists of the leftover lubricant. The zoned lubricant layer of the invention hence decreases the flying stiction.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 3 lists the conditions for eight control variables of the process for bonding lubricant to a magnetic disk according to a preferred embodiment of the present invention.

FIG. 4 shows the thickness of the bonding lubricant layer on distinct zones of two magnetic disks under different conditions of the control variables listed in FIG. 3.

FIG. 5 lists the average of the S/N ratios under one condition of a control variable.

FIG. 9 shows the S/N ratios are improved by changing the gas composition in the sputtering chamber.

FIG. 13 shows the experimental results according to a preferred embodiment of the process of the present invention, wherein the thickness and volume ratio of the bonded lubricant layer of the lubricant layer are measured on the landing zone and the data zone of the magnetic disk.

DETAILED DESCRIPTION OF THE PREFERRED EMBODIMENT

Figure 1:
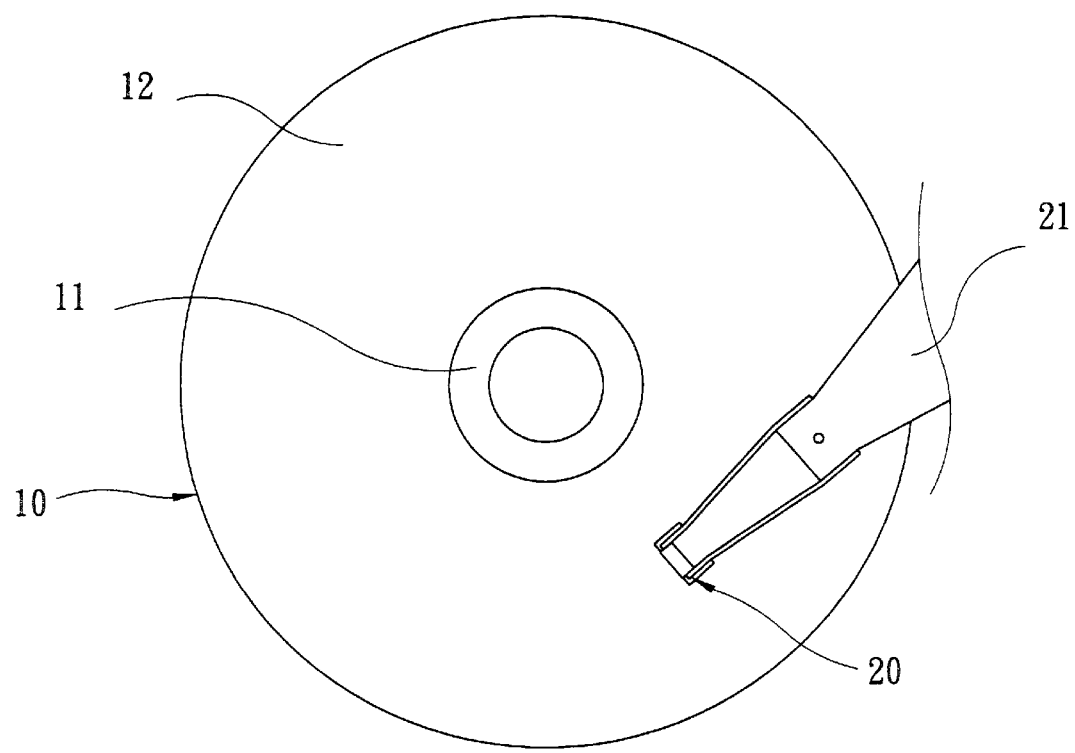
FIG. 1 is the structure of a hard disk drive with a magnetic disk and a magnetic head assembly.
Figure 2:
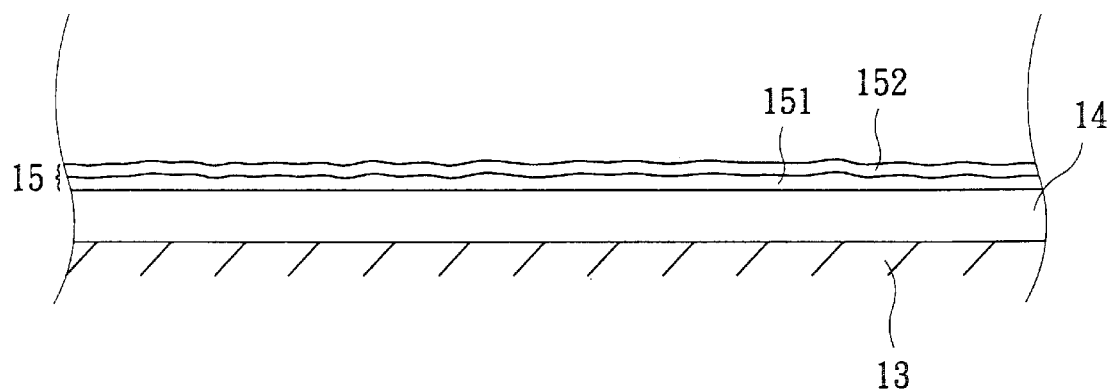
FIG. 2 is the cross-section view of a magnetic disk which illustrates the relation of an overcoat layer and a lubricant layer.

As shown in FIG. 1, a magnetic disk 10 of a hard disk drive includes a landing zone 11 on its inner diameter for the landing and takeoff of a read/write head 21 and a data zone 12 on the rest of the disk. The read/write head 21 is supported by an actuator arm 20 for its motion. In FIG. 2, the cross-section view of the magnetic disk 10 is shown. The magnetic disk 10 includes a magnetic substrate 13. an overcoat layer 14 formed by sputtering and a lubricant layer 15 constructed by coating lubricant on the overcoat layer 14 where the lubricant layer 15 contains a bonded lubricant layer 151 whose lubricant is covalently bonded to the overcoat 14, and a free lubricant layer 152 which locates upon the bonded lubricant layer 151.

The flying stiction of the read/write head 21 greatly relates to the thickness of the lubricant layer 15. In addition the thickness of the lubricant layer 15 is also dependent on the chemistry and thickness of the overcoat layer 14. The present invention is to provide a method to form the overcoat layer 14 with distinct zones whose chemistry and thickness are different. According to the present invention, the chemistry and thickness of the overcoat layer 14 are different on the landing zone 11 and the data zone 12 of the magnetic disk 10. With the relation that the thickness of the bonded lubricant layer 151 and the free lubricant layer 152 of the lubricant layer 15 depends on the chemistry and thickness of the overcoat layer 14, the thickness of the lubricant layer 15 is consequently suitable for decreasing the flying stiction of the read/write head 21.

In order to make the chemistry and thickness of the overcoat layer 14 different on distinct zones (such as: the landing zone and data zone), the condition of sputtering the overcoat layer 14 must be controllable, and a plurality of masks are used. Then, the lubricant layer 15 is coated on the overcoat layer 14. The bonded lubricant layer 151 and the free lubricant layer 152 are consequently formed for reducing the flying stiction. The process for bonding lubricant to the magnetic disk 10 of the present invention includes the following steps:

a. control the atmosphere condition of sputtering;

b. cover the landing zone 11 of the magnetic disk 10 by using a mask and expose the data zone 12;

c. form an overcoat on the data zone 12 of the magnetic disk 10 by sputtering;

d. remove the mask for covering the landing zone 11;

e. cover the data zone 12 of the magnetic disk 10 by using another mask and expose the landing zone 11;

f. form another overcoat on the landing zone 11 of the magnetic disk 10 by sputtering;

g. remove the mask for covering the data zone 12; and h. coat lubricant on the whole surface of the magnetic disk 10 including the landing zone 11 and data zone 12.

It is noted that the sequence of the steps b~d and the steps e~g can be exchanged without affecting the result of the invention.

Since the thickness ratio of the bonded lubricant layer 151 and the free lubricant layer 152 relates to the chemistry and thickness of the overcoat layer 14, the atmosphere condition of sputtering must be controllable. The atmosphere condition of sputtering includes the species of gas and its volume such as argon (Ar), hydrogen ($H_2$), nitrogen ($N_2$) and methane ($CH_4$). The better atmosphere condition of sputtering is chosen by experiences described in the following.

FIG. 3 lists the conditions of eight control variables of the process for bonding lubricant to a magnetic disk according to the invention. All control variables of the experience of the invention are explained as follows:

1. the control variable A denotes the volume ratio of the hydrogen;

2. the control variable B denotes the volume ratio of the nitrogen;

3. the control variable C denotes the power of sputtering;

4. the control variable D denotes the gas flow (unit: sccm) of the hybrid gas which mixes hydrogen, nitrogen and argon with their volume ratios;

5. the control variable E denotes the dwell time of a magnetic disk dwelled in lubricant;

6. the control variable F denotes the drain rate of coating lubricant on a magnetic disk;

7. the control variable G denotes if a coated magnetic disk is purged in nitrogen;

8. the control variable H denotes the concentration of lubricant.

It is noted that the sum of the volume ratios of hydrogen, nitrogen and argon is 100%. In FIG. 4, the experimental results, i.e. the thickness of the bonding lubrication layer on distinct zones (such as: the landing zone and data zone) of two magnetic disks, are shown under different conditions of the control variables listed in FIG. 3. According to the experimental result shown in FIG. 2, it grows a thicker bonding lubricant layer when the volume of hydrogen ($H_2$) and the lube concentration increase. The evaluation of the thickness of the bonding lubricant layer is to measure the bonding lube signal-to-noise ratio (S/N). For given number of repeating bonded lubricant thickness measurement, the index to the average divided by the standard derivation ($\sigma$) is denoted as the signal-to-noise ratio of bonded lubricant thickness.

For example, four bonded lubricant thickness measured as follow:

| 1 | 2 | 3 | 4 |
|---|---|---|---|
| 8.1 | 8.3 | 7.9 | 8.2 |

$$\text{average} = \frac{8.1 + 8.3 + 7.9 + 8.2}{4} = 8.125$$

$$\sigma = \sqrt{\frac{(8.1-8.125)^2 + (8.3-8.125)^2 + (8.2-8.125)^3 + (7.9-8.125)^2}{4}}$$

$$= 0.148$$

$$S/N = \frac{8.125}{0.148} = 54.9$$

In FIG. 4, the measured S/N ratios are shown in the last column such as the first six S/N ratios 15.07, 13.66, 14.38, 13.88, 15.39 and 13.40 are measured as the volume ratio of hydrogen is 10%. FIG. 5 lists the average of the S/N ratios under one condition of a control variable, for example, the first value 15.63 of the table is the average of the S/N ratios (15.07, 13.66, 14.38. 13.88. 15.39 and 13.40) as the volume ratio of hydrogen is 10%. It is obvious that the concentration of lubricant causes the largest variance of the S/N ratio averages of different conditions. Besides, the control variables, the volume ratio of hydrogen and nitrogen, the power of sputtering and the purge of nitrogen, clearly affect the variance of the S/N ratio averages.

Figure 6:
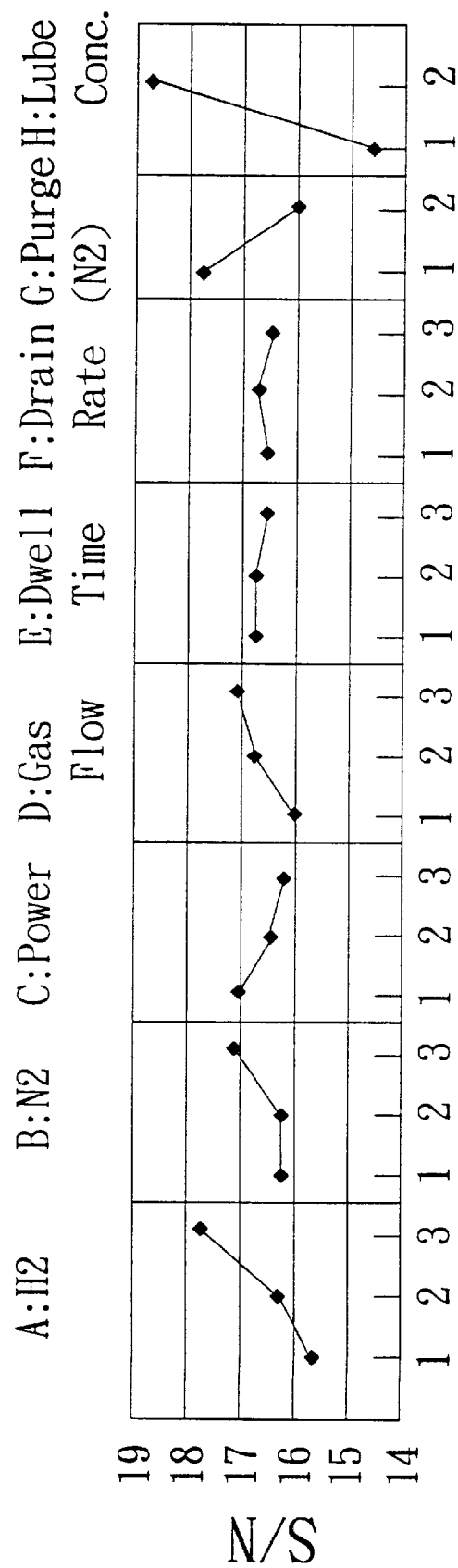
FIG 6 shows the S/N variance graphs of all control variables under their respective experimental conditions.
Figure 7:
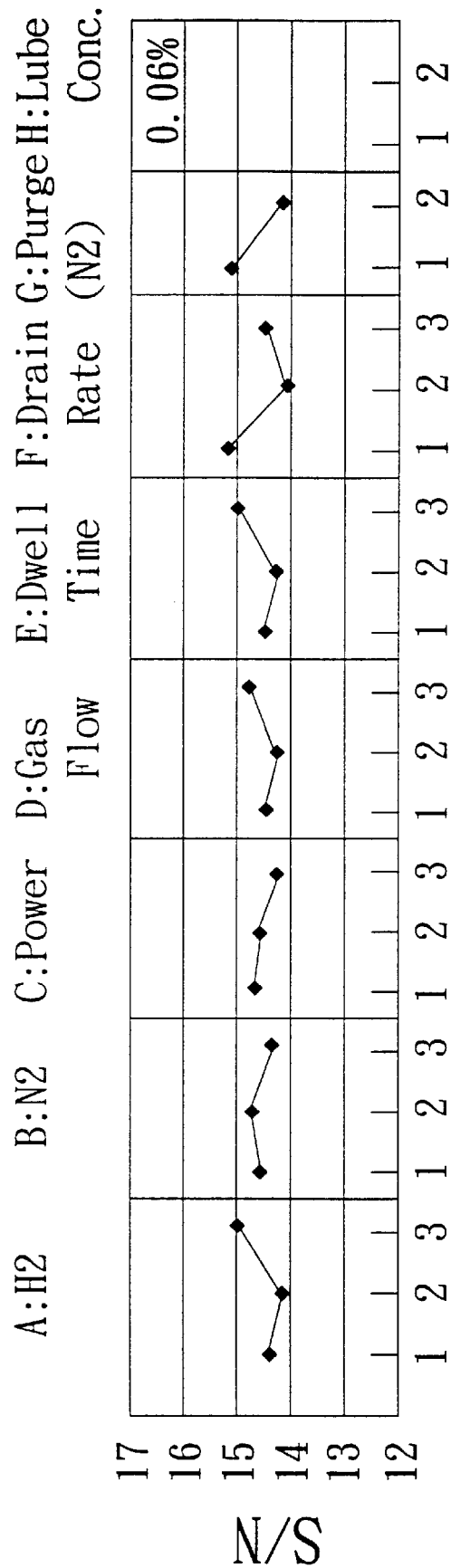
FIGS. 7 and 8 show experimental results of how the concentration of lubricant causes the largest variance of the S/N ratio of a magnetic disk.
Figure 8:
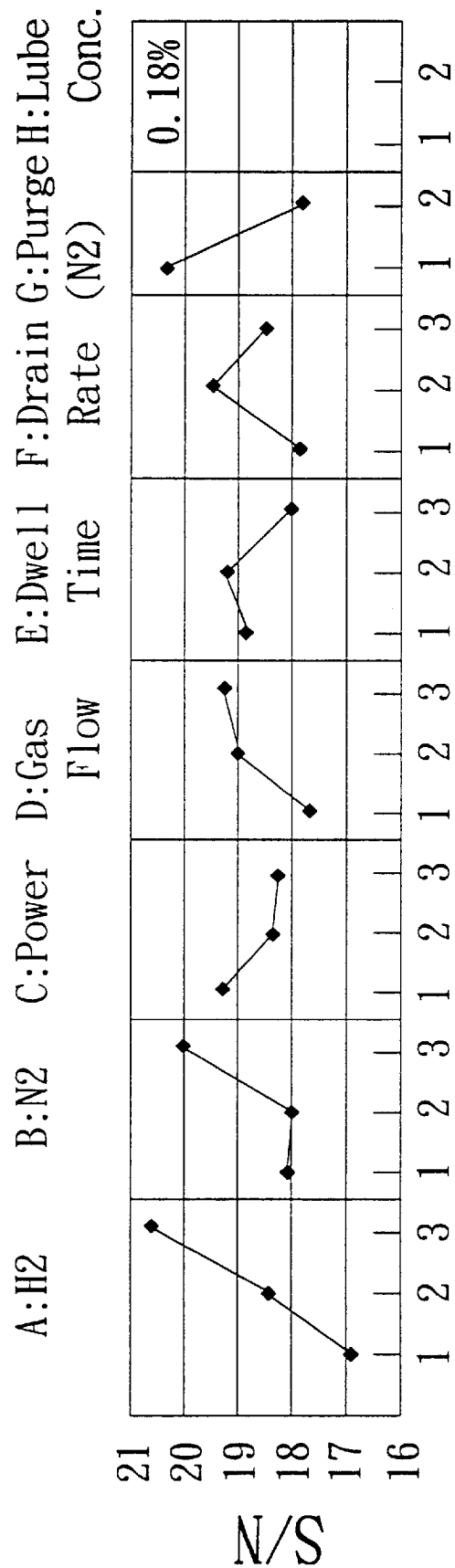

FIG. 6 shows the S/N variances graphs of all control variables under their different conditions. According to these results, suitable control conditions can be chosen to get larger S/N ratio of a magnetic disk, i.e. the thicker bonding lubricant layer, and smaller flying stiction is secured. Since the concentration of lubricant induces the largest variance of the S/N ratio of a magnetic disk, two additional concentrations 0.06% and 0.18% of lubricant are used for experiment. The experimental results are shown in FIGS. 7 and 8. Select the conditions of the control variables inducing the maximum S/N ratio, i.e. A3B3C1D3E2F2G1H2, as the preferable process conditions of the invention. With these process conditions, the S/N ratio of the present invention has 80% enhancement of the prior art. Hence. combining the employment of masks and the control of the sputtering conditions of the invention, the overcoat layer 14 with distinct zones of differing thickness can be made on the magnetic disk 10. After coating the lubricant layer 15, the thickness of the bonded lubricant layer 151 is consequently different on distinct zones, and so does the free lubricant layer 152. This is the reason why the flying stiction is reduced.

FIG. 9 shows the S/N ratios improves by changing the gas composition in the sputtering chamber.

Figure 10:
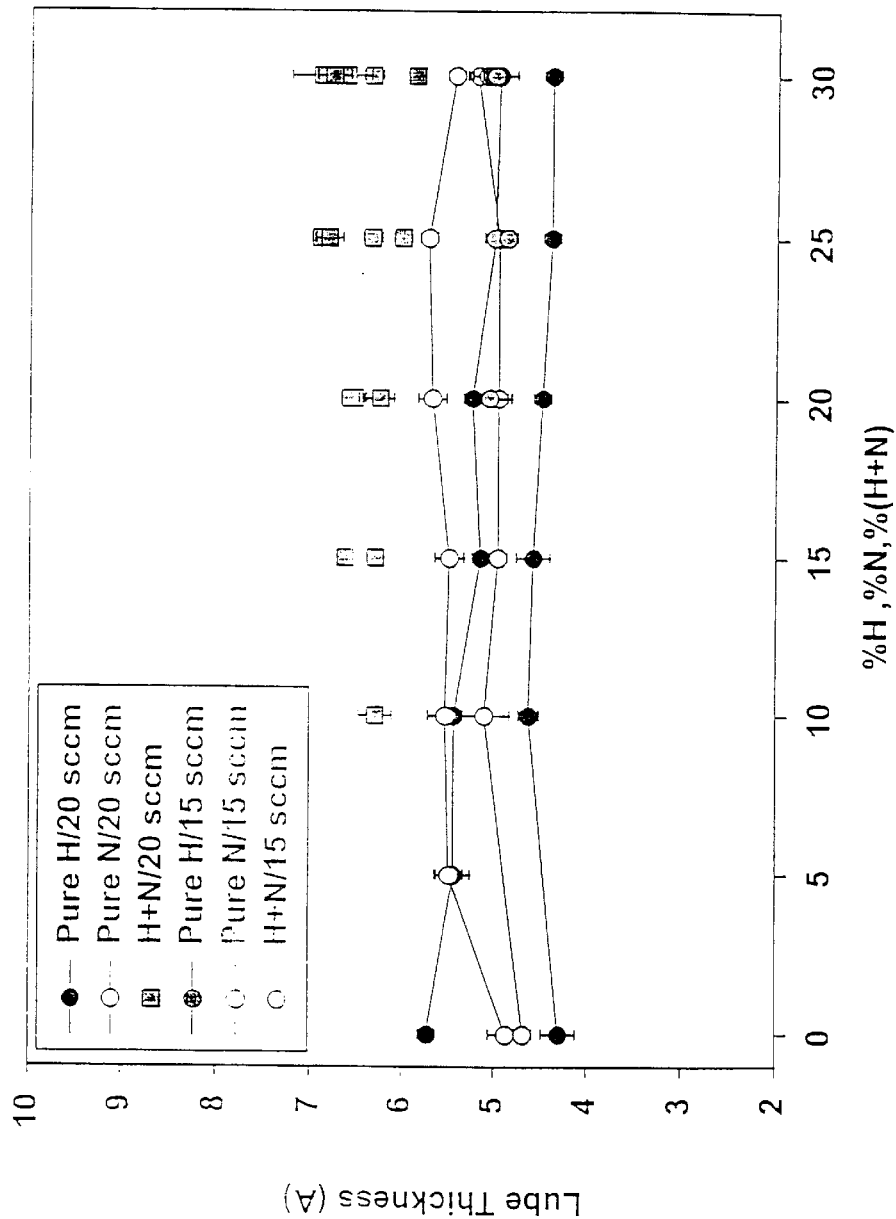
FIGS. 10 and 11 show the experimental results of increasing the thickness of the lubricant layer without increasing the thickness of the bonded lubricant layer, by changing the volume ratios of hydrogen, nitrogen, and argon, while keeping the concentration of lubricant and gas flow rate constant.
Figure 11:
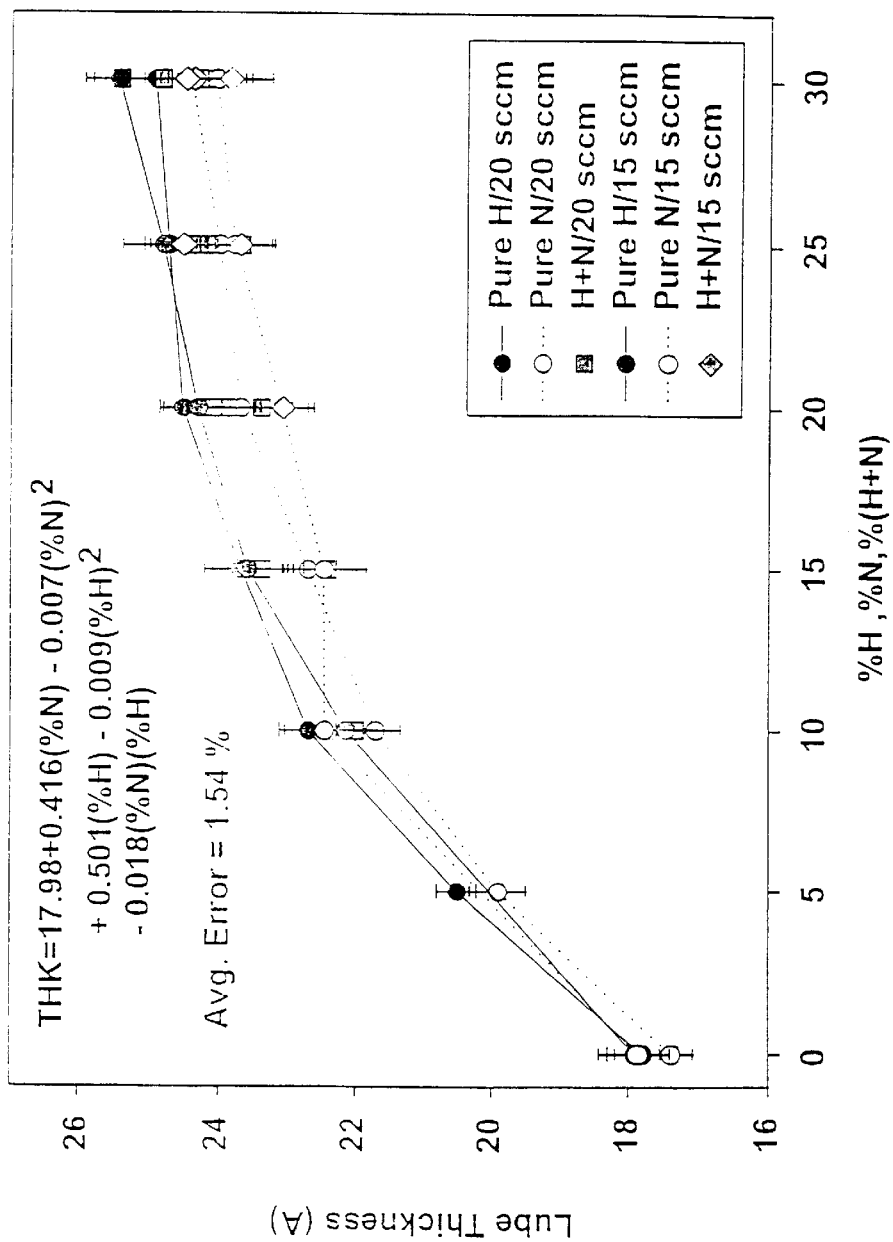
Figure 12:
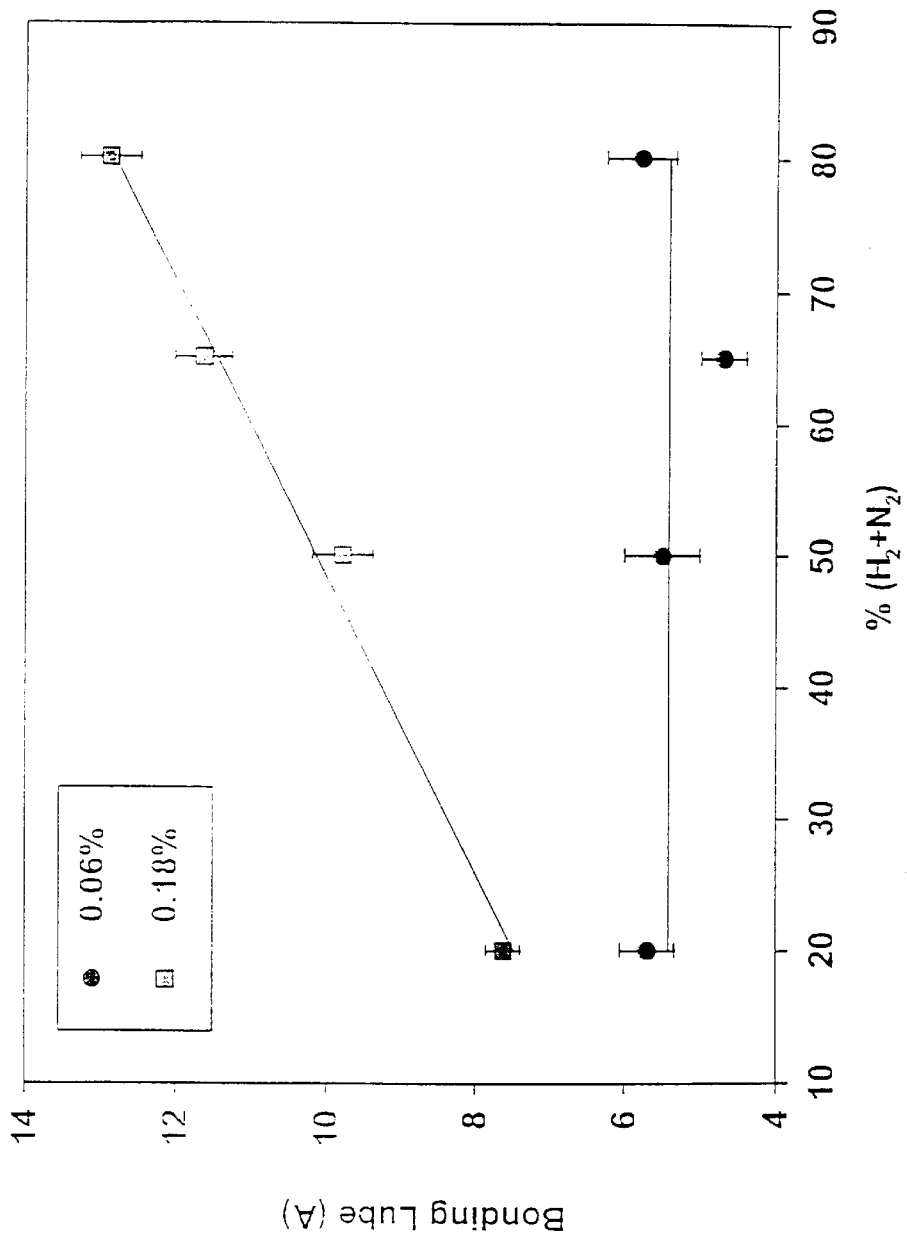
FIG. 12 shows the experimental results of increasing the thickness of the bonded lubricant layer by increasing the volume ratio of hydrogen and nitrogen, while keeping the concentration of lubricant constant.

According to the experimental results shown in FIGS. 10 and 11, with constant concentration of lubricant 0.06% and constant gas flow rate, the thickness of the lubricant layer 15 is increased without increasing the bonded lubricant layer's thickness by changing the volume ratios of hydrogen, nitrogen and argon. Alternatively, in FIG. 12, with constant concentration of lubricant 0.18%, the thickness of the bonded lubricant layer 151 is obviously increased by increasing the volume of hydrogen and nitrogen. According to the process of the present invention, the thickness of the bonded lubricant layer 151 is controlled by suitably choosing a concentration of lubricant without greatly changing the lubricant layer's thickness. Similarly, the thickness of the lubricant layer 15 is controlled by choosing another concentration of lubricant without greatly changing the bonded lubricant layer's thickness.

FIG. 13 shows the experimental result according to the process of the present invention, which the thickness and volume ratio of the bonded lubricant layer 151 of the lubricant layer 15 are measured on the landing zone and the data zone of the magnetic disk 10. It is noted that the thickness and volume ratio of the bonded lubricant layer 151 can be controlled within a suitable range. Hence, according to the present invention, it can be achieved that 1. the same thickness of the lubricant layer on the landing zone and the data zone, but different thickness of the bonded lubricant layer on both zones;
2. different thickness of the lubricant layer on the landing zone and the data zone, but the same thickness of the bonded lubricant layer on both zones; and
3. different thickness of the lubricant layer on the landing zone and the data zone, and different thickness of the bonded lubricant layer on both zones.

The present invention provides a magnetic disk with distinct zones of differing lubricant thickness for decreasing the flying stiction on the disk surface. In addition, it also provides a simple process for forming a lubricant layer of differing thickness on distinct zones of a magnetic disk of a hard disk drive without heating, inert gas plasma and UV-radiation or E-beam exposition.

It is noted that the process for bonding lubricant to a magnetic disk described above are the preferred embodiments of the present invention for the purposes of illustration only, and are not intended as a definition of the limits and scope of the invention disclosed. Any modifications and variations that may be apparent to a person skilled in the art are intended to be included within the scope of the present invention.

What is claimed is:

1. A process for bonding lubricant on a magnetic disk of a hard disk drive comprising the following steps:

controlling atmosphere conditions of a sputtering process which includes a plurality of gases;

covering the landing zone of said magnetic disk with a first mask, and exposing the data zone of said magnetic disk;

forming an overcoat on the data zone of said magnetic disk by sputtering; removing said first mask;

changing said atmosphere conditions of said sputtering process;

covering the data zone of said magnetic disk with a second mask, and exposing the landing zone of said magnetic disk;

forming another overcoat on the landing zone of said magnetic disk by sputtering;

removing said second mask; and coating lubricant on the whole surface of said magnetic disk including its landing zone and data zone to form a lubricant layer with a bonded lubricant layer and a free lubricant layer.

2. The process for bonding lubricant on a magnetic disk of a hard disk drive as claimed in claim 1 wherein said gases comprise hydrogen and argon.

3. The process for bonding lubricant on a magnetic disk of a hard disk drive as claimed in claim 1 wherein said gases comprise nitrogen and argon.

4. The process for bonding lubricant on a magnetic disk of a hard disk drive as claimed in claim 1 wherein said gases comprise hydrogen, nitrogen and argon.

5. The process for bonding lubricant on a magnetic disk of a hard disk drive as claimed in claim 1 wherein said gases comprise methane and argon.

6. The process for bonding lubricant on a magnetic disk of a hard disk drive as claimed in claim 1 wherein said gases comprise methane, nitrogen and argon.

7. The process for bonding lubricant on a magnetic disk of a hard disk drive as claimed in claim 1 wherein said atmosphere conditions comprise the pressure and flow rate of said gases.

8. The process for bonding lubricant on a magnetic disk of a hard disk drive as claimed in claim 1 wherein the thickness of said lubricant layer is the same on the landing zone and the data zone of said magnetic disk, but the thickness of said bonded lubricant layer is different on both zones.

9. The process for bonding lubricant on a magnetic disk of a hard disk drive as claimed in claim 1 wherein the thickness of said lubricant layer is different on the landing zone and the data zone of said magnetic disk, but the thickness of said bonded lubricant layer is the same on both zones.

10. The process for bonding lubricant on a magnetic disk of a hard disk drive as claimed in claim 1 wherein the thickness of said lubricant layer and said bonded lubricant layer both are different on the landing zone and the data zone of said magnetic disk.

11. The process for bonding lubricant on a magnetic disk of a hard disk drive as claimed in claim 1 wherein, the thickness of said bonded lubricant layer is of about 5 to 13 angstroms.

12. The process for bonding lubricant on a magnetic disk of a hard disk drive as claimed in claim 1 wherein the volume ratio of said bonded lubricant layer is of about 25% to 65% in said lubricant layer.

13. A process for forming overcoat layers on distinct zones of a magnetic disk of a hard disk drive, comprising the following steps:

controlling atmosphere conditions of a sputtering process which includes controlling the flow of a plurality of gases;

forming a first overcoat layer on a partial surface of said magnetic disk by sputtering;

changing said atmosphere conditions, including changing the gas composition of said sputtering process; and forming a second overcoat layer on the residual surface of said magnetic disk by sputtering.

14. The process for forming overcoat layers on distinct zones of a magnetic disk of a hard disk drive as claimed in claim 13 wherein said gases comprise hydrogen and argon.

15. The process for forming overcoat layers on distinct zones of a magnetic disk of a hard disk drive as claimed in claim 13 wherein said gases comprise nitrogen and argon.

16. The process for forming overcoat layers on distinct zones of a magnetic disk of a hard disk drive as claimed in claim 13 wherein said gases comprise hydrogen, nitrogen and argon.

17. The process for forming overcoat layers on distinct zones of a magnetic disk of a hard disk drive as claimed in claim 13 wherein said gases comprise methane and argon.

18. The process for forming overcoat layers on distinct zones of a magnetic disk of a hard disk drive as claimed in claim 13 wherein said gases comprise methane, nitrogen and argon.

19. The process for forming overcoat layers on distinct zones of a magnetic disk of a hard disk as claimed in claim 13 wherein said atmosphere conditions comprise the volume of said gases.

20. The process for forming overcoat layers on distinct zones of a magnetic disk of a hard disk drive as claimed in claim 13 wherein said atmosphere conditions comprise the flow rate of said gases.

* * * * *